(12) United States Patent
Yonekura et al.

(10) Patent No.: US 6,831,318 B2
(45) Date of Patent: Dec. 14, 2004

(54) THIN FILM TRANSISTOR ARRAY

(75) Inventors: Hiroaki Yonekura, Ishikawa (JP); Mitsuhiro Uno, Ishikawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 147 days.

(21) Appl. No.: 10/368,188

(22) Filed: Feb. 18, 2003

(65) Prior Publication Data

US 2003/0122127 A1 Jul. 3, 2003

Related U.S. Application Data

(63) Continuation of application No. 09/611,573, filed on Jul. 7, 2000, now abandoned.

(30) Foreign Application Priority Data

Jul. 7, 1999 (JP) ............................................ 11-193187

(51) Int. Cl.[7] ............................................ H01L 27/108
(52) U.S. Cl. ........................ 257/296; 257/306; 349/39; 349/41
(58) Field of Search ............................ 257/52, 59, 72, 257/187, 258, 291, 296, 298, 300, 303, 306, 353, 516, 532, 535; 349/39, 41, 42, 43, 47

(56) References Cited

U.S. PATENT DOCUMENTS

| | | | |
|---|---|---|---|
| 5,737,049 A | * | 4/1998 | Shin et al. .................. 349/122 |
| 5,953,598 A | | 9/1999 | Hata et al. |
| 6,043,511 A | * | 3/2000 | Kim ............................. 257/59 |
| 6,064,363 A | | 5/2000 | Kwon |
| 6,191,828 B1 | | 2/2001 | Kim et al. |
| 6,236,062 B1 | | 5/2001 | Nakahori et al. |
| 6,309,980 B1 | | 10/2001 | Tokunaga et al. |
| 6,355,572 B1 | | 3/2002 | Ikegami |
| 6,469,769 B2 | * | 10/2002 | Ozaki ......................... 349/187 |
| 2001/0040649 A1 | * | 11/2001 | Ozaki ......................... 349/43 |

FOREIGN PATENT DOCUMENTS

JP          10-221705          8/1998

* cited by examiner

Primary Examiner—John F. Niebling
Assistant Examiner—Stanetta Isaac
(74) Attorney, Agent, or Firm—RatnerPrestia

(57) ABSTRACT

A display device driving circuit comprising a thin film transistor array in combination with a charge capacitor and its manufacturing method in which the charge capacitor is formed over an address line for addressing the thin film transistor by depositing first an insulating layer over the address line and then a semiconductor layer. The semiconductor layer is etched to form a protective island. The protective island protects the insulating layer integrity during subsequent etching processes. An upper electrode is formed over the semiconductor layer to complete the charge capacitor. The protection of the insulating layer during subsequent manufacturing steps results in substantially uniform charge capacitors for each TFT in the driving circuit.

11 Claims, 5 Drawing Sheets

THIN FILM TRANSISTOR ARRAY

THIS APPLICATION IS A CONTINUATION OF U.S. patent application Ser. No. 09/611,573, FILED Jul. 7, 2000 now abandoned.

FIELD OF THE INVENTION

The present invention relates to the field of thin film transistor array driver circuits used to drive active matrix liquid crystal display devices and their manufacturing methods. More particularly, the present invention relates to thin film transistor arrays for driving liquid crystal display devices that include a charge capacitor.

BACKGROUND OF THE INVENTION

Display devices using liquid crystal achieve low power consumption and reduced weight, which represent considerable improvements on conventional CRT displays. In particular, active matrix liquid crystal display devices using thin film transistors (TFTs), acting as a switching device for each pixel, are extensively used in displays for notebook PCs and car navigation systems due to their advantages of sharp images with less crosstalk. The use of these active matrix liquid crystal display devices is rapidly extending to large display monitors.

A conventional circuit containing a TFT array for driving this type of liquid crystal display devices is described next with reference to drawings. FIG. 3 is a schematic diagram of an example of a conventional TFT array in a liquid crystal display device. FIG. 4 is a sectional view taken along the broken line 4—4 in FIG. 3. In this example, as shown in FIGS. 3 and 4, scanning lines 2 and video signal lines 5 are disposed in a matrix on a glass substrate 1. A pixel electrode 7, TFT 13, and storage capacitor 14 are disposed in a region surrounded by the scanning lines and video signal lines. The TFT 13 is mainly made of an amorphous silicon semiconductor layer 4. The TFT drain electrode 11 and the pixel electrode 7 are connected through a contact pattern 8. The video signal line 5 also acts as the source electrode of the TFT 13. The storage capacitor 14 is formed between an upper electrode 10 and the scanning line 2 so as to sandwich the first insulating film 3 which becomes a gate insulator. A second insulating layer 6 is formed as a passivation insulating layer for protecting the TFT 13.

Operation of the liquid crystal display device using the TFT array as configured above is described next.

First, when voltage is applied to the scanning line 2, which is the TFT gate electrode, a channel is established in the amorphous silicon semiconductor layer 4 of the TFT 13. Then, video signals from the video signal line 5 are fed to the drain electrode 11 through the TFT channel, and reach the pixel electrode 7 to change the orientation of the liquid crystal (not illustrated) held between the pixel electrode 7 and counter electrode (not illustrated) to the intended degree by a magnetic field established between the pixel electrode 7 and the counter electrode facing the pixel electrode 7. This adjusts the light transmittance to produce the required images.

In general, a storage capacitor is provided to the pixel electrode for maintaining the pixel electrode potential until the scanning signals are applied for the next frame. With the increased size of monitor displays, formation of a uniform electric capacitance in this storage capacitor is becoming a key factor in reducing defects such as uneven luminance and improving image quality of uniformity.

TFT arrays as described above are generally manufactured by means of the next key steps. Midway steps in the manufacturing process are described next with reference to FIGS. 6A to 6D. FIGS. 6A to 6D are sectional views taken along the broken line 6—6 in FIG. 3, with the left part illustrating the storage capacitor 14 and the right part illustrating the TFT 13.

A first metal layer is formed on the glass substrate 1, and the metal is selectively etched to form the pattern of the scanning lines 2. Then, the gate insulator 3, which is the first insulating layer, is formed. The semiconductor layer is next formed, and the pattern of the TFT channel 4 is etched (FIG. 6A). Next, a second metal layer is formed, and this is selectively etched to simultaneously form patterns of the video signal line 5, drain electrode 11, and upper electrode 10 on the storage capacitor (FIG. 6B). The second insulating layer 6, which is the TFT passivation layer, is next formed and this layer is selectively etched to create openings 8 and 12 respectively on the drain electrode 11 and the upper electrode 10 of the storage capacitor (FIG. 6C). Finally, a transparent conductive layer is formed, and this is selectively etched to form the pattern of the pixel electrode 7.

With this conventional configuration, however, the exposed gate insulator 3 is often over-etched during the step of etching the channel 4 of the TFT 13, as is clear from FIG. 6A. As a result, the thickness of the remaining gate insulator 3 becomes non-uniform, also causing non-uniform thickness in a dielectric layer of the storage capacitor 14. This results in variations in capacitance of the storage capacitor 14 among pixels, leading to image defects such as uneven luminance.

SUMMARY OF THE INVENTION

The present invention aims to offer a thin film transistor array and its manufacturing method for achieving a uniform electric capacitance for the storage capacitors and reducing defects such as uneven luminance so as to improve image uniformity. It is therefore an object of this invention to provide a driving circuit which may be used, inter alia, for driving a display device comprising:

a thin film transistor a pixel electrode electrically connected to said thin film transistor a scanning line connected to the thin film transistor;

an insulating layer over said scanning line;

a semiconductor layer over a portion of the insulating layer and the scanning line and a storage capacitor comprising an upper capacitor electrode formed over the semiconductor layer electrically connected to said pixel electrode.

Another object of this invention is a circuit for driving a display device comprising an array of a plurality of display elements each of the display elements comprising a pixel electrode, the circuit also comprising an array of scanning lines and an array of signal lines the signal lines arrayed substantially perpendicular to the scanning lines and electrically insulated therefrom, and a plurality of individual drivers, one driver for each display element, each of the individual drivers comprising:

a thin film transistor connected to a scanning line and a pixel electrode;

a storage capacitor electrically connected to the pixel electrode comprising an upper capacitor electrode, a dielectric layer and a lower electrode wherein the dielectric layer comprises an insulating layer over the lower electrode and a semiconductor layer over the insulating layer and under the upper electrode.

Still an object of this invention is a display device comprising an array of liquid crystal display elements each comprising a pixel electrode the display device further comprising an electronic circuit for driving the display device, the electronic circuit comprising an array of scanning lines and an array of signal lines the signal lines arrayed substantially perpendicular to the scanning lines and electrically insulated therefrom, and a plurality of individual drivers, one driver for each display element, each of said individual drivers comprising:

a thin film transistor connected to one of said scanning lines and said pixel electrode;

a storage capacitor also electrically connected to said pixel electrode, comprising an upper capacitor electrode, a lower electrode and a dielectric layer therebetween, wherein said dielectric layer comprises a first insulating layer over said lower electrode and a semiconductor layer over said first insulating layer and under said upper electrode.

Further, still in accordance with this invention, there is contemplated a method for manufacturing the thin film transistor array of the present invention that comprises the steps of forming a scanning line pattern on the insulated substrate; depositing the first insulating layer; forming a semiconductor island pattern for each TFT and storage capacitor by selective etching; forming patterns for video signal lines and an upper electrode for the storage capacitor by selective etching; and forming a pixel electrode pattern by selective etching.

Provision of the island pattern of the semiconductor layer between the upper electrode of the storage capacitor and the dielectric of the first insulating layer, which becomes the gate insulator, makes it possible to suppress any over-etching of the first insulating layer which acts as the dielectric of the storage capacitor during the step of forming the semiconductor island pattern. Accordingly, the dielectric layer of the storage capacitor is uniformly formed, reducing typical defects of liquid crystal display devices such as uneven luminance, and thus improving the uniformity of the images.

The method for forming a driving circuit for driving a display device when the driving circuit comprises a thin film transistor and a charge capacitor, comprises:

forming on a substrate a first conductive layer selectively etching said first conductive layer to form at least one scanning line;

forming a first insulating layer over said etched conductive layer and substrate forming a semiconductor layer over said first insulating layer selectively etching said semiconductor layer to form a thin film transistor channel and a protective island over said scanning line, said scanning line forming a gate electrode for said thin film transistor;

forming a second conductive layer over said etched semiconductive layer and said first insulating layer; and selectively etching said second conductive layer to form an upper capacitor electrode for said charge capacitor over said semiconductor island, the scanning line forming a lower electrode for said charge capacitor, and to form a drain and a source electrodes for said thin film transistor.

DESCRIPTION OF THE PREFERRED EMBODIMENT

Figure 1:
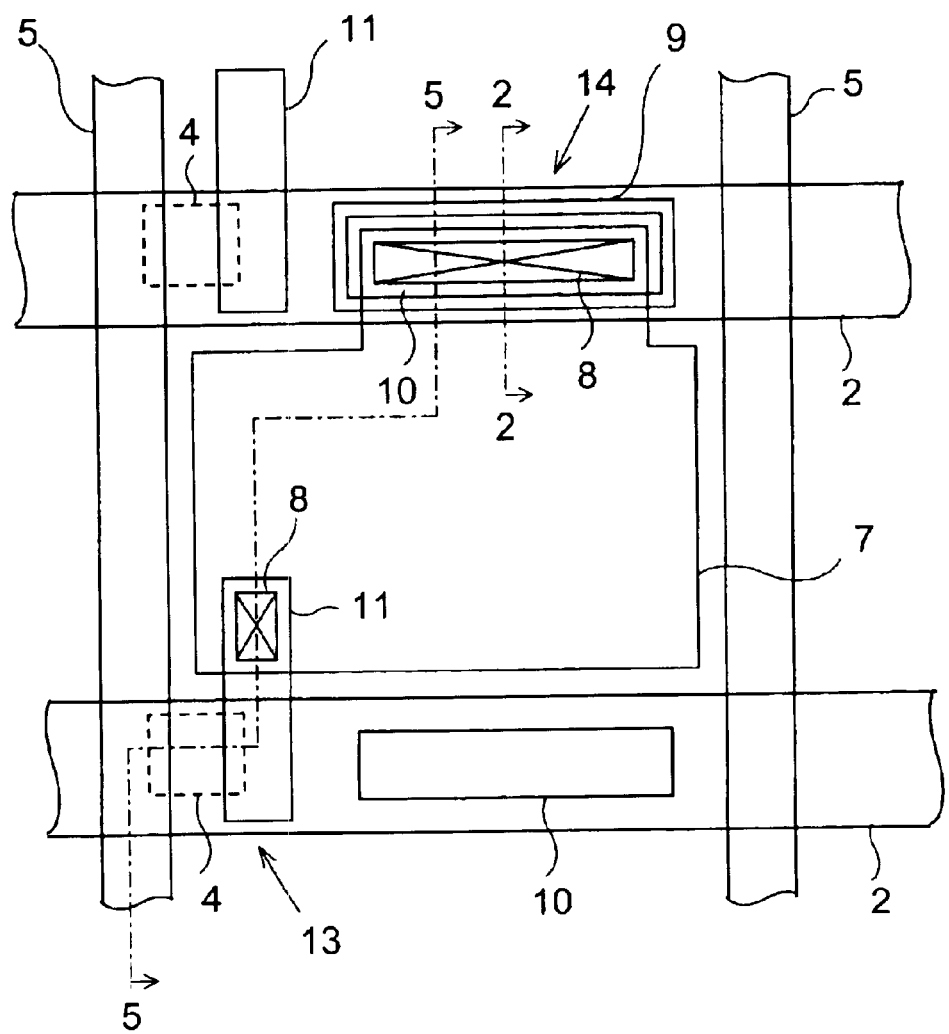
FIG. 1 is a schematic diagram of a thin film transistor in accordance with a preferred embodiment of the present invention.

A preferred embodiment of the present invention is described below with reference to FIGS. 1, 2, 5A to 5D and 7. Parts same as those of the prior art are given the same reference numerals.

Figure 2:
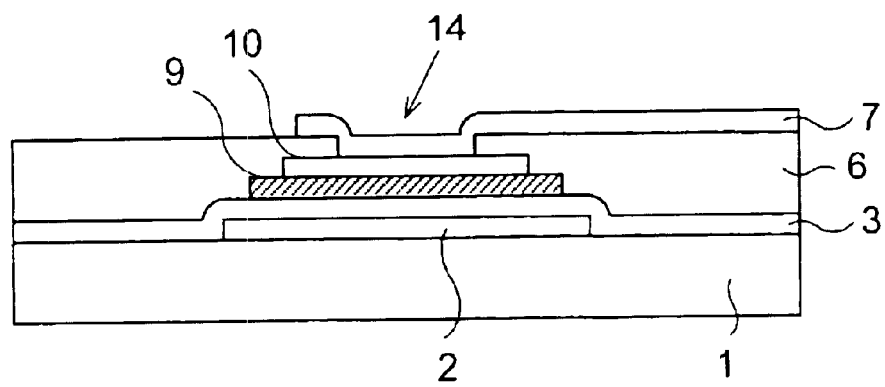
FIG. 2 is a sectional view taken along a broken line 2—2 in FIG. 1.

FIG. 1 is a schematic diagram of a TFT array in a preferred embodiment of the present invention. FIG. 2 illustrates a cross-sectional structure of a storage capacitor 14, which is a sectional view taken along a broken line 2-2 in FIG. 1.

Figure 3:
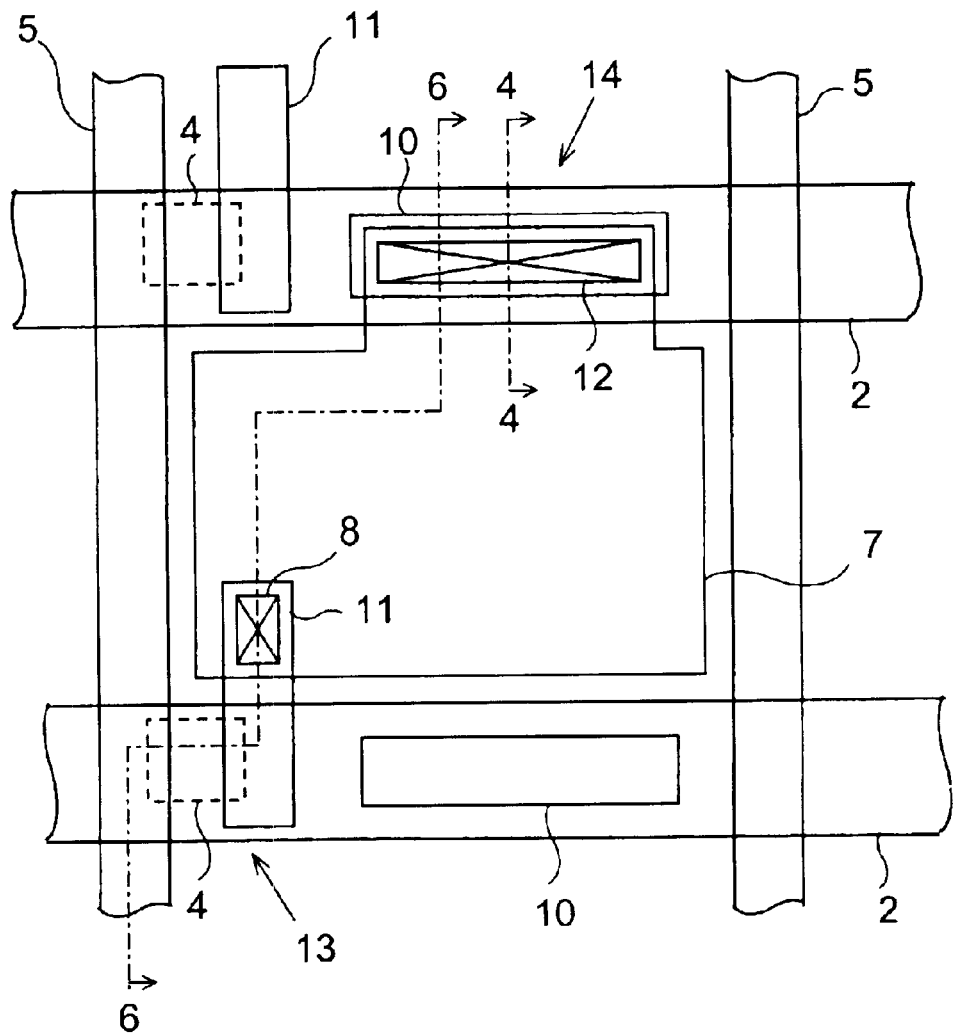
FIG. 3 is a schematic diagram of a conventional thin film transistor array.
Figure 4:
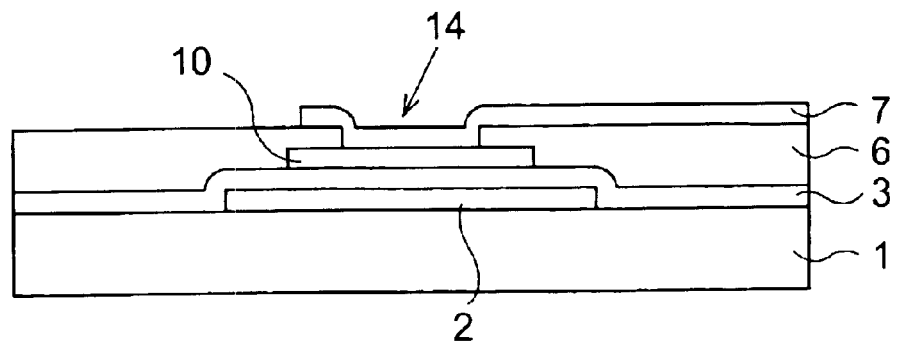
FIG. 4 is a sectional view taken along a broken line 4—4 in FIG. 3.

As shown in FIG. 1, a scanning line 2 which supplies scanning signals to a TFT gate electrode and also acts as the TFT gate electrode, and a video signal line 5 which supplies video signals and also acts as a source electrode of a TFT 13 are formed on a glass substrate 1 in a matrix in the TFT array of the preferred embodiment. A pixel electrode 7 is disposed in a region surrounded by the scanning lines 2 and video signal lines 5. Each pixel electrode 7 is connected to the video signal line 5 through a drain electrode 11 of the TFT 13 using a hydrogenated amorphous silicon semiconductor layer 4. A storage capacitor 14 is formed between the upper electrode 10 and an upper scanning line 2. The above basic configuration is equivalent to that of the prior art described using FIG. 3.

Figure 5A:
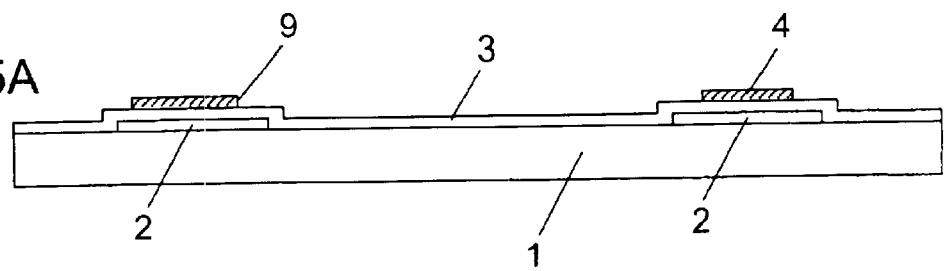
FIGS. 5A to 5D are sectional views illustrating steps of manufacturing the thin film transistor array in accordance with the preferred embodiment of the present invention.
Figure 5B:
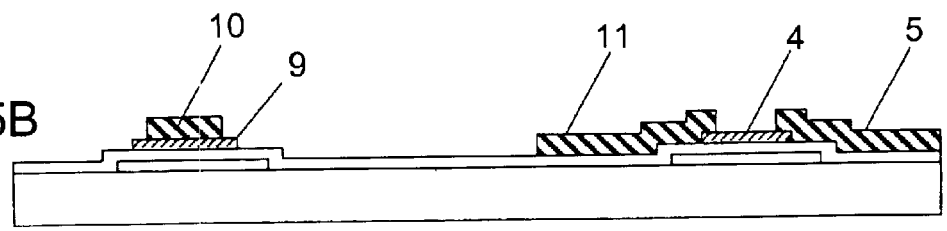
Figure 5C:
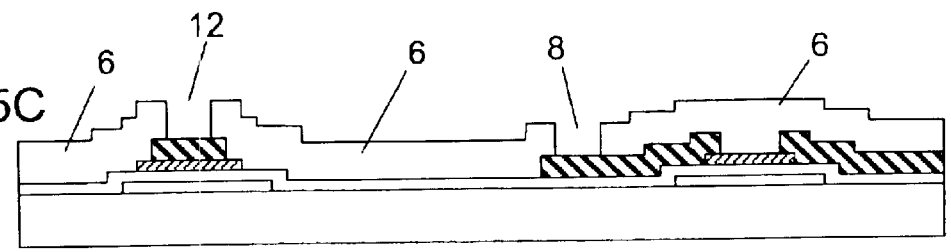
Figure 5D:
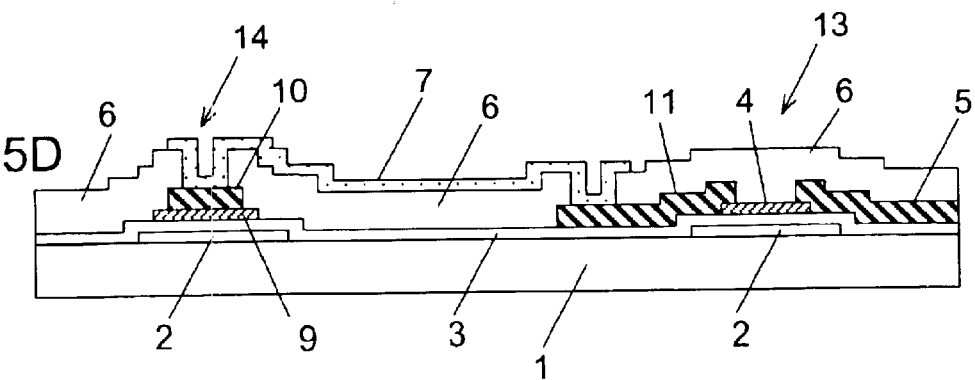
Figure 6A:
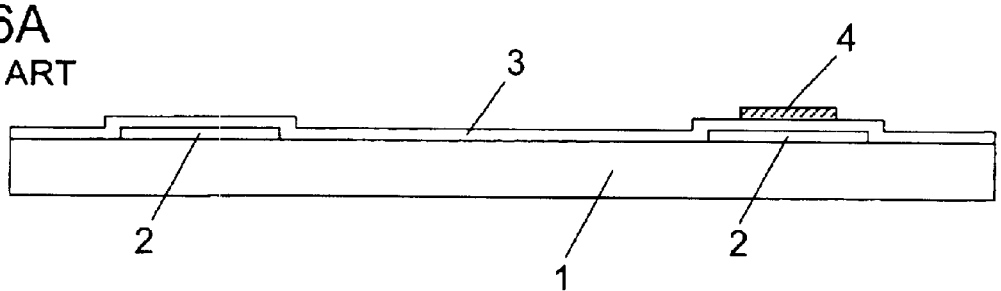
FIGS. 6A to 6D are sectional views illustrating steps of manufacturing the conventional thin film transistor array.
Figure 6B:
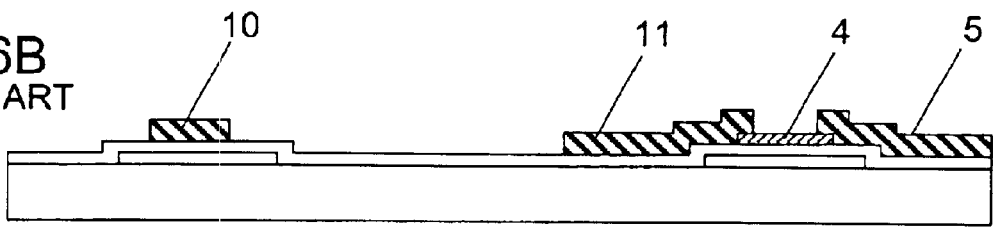
Figure 6C:
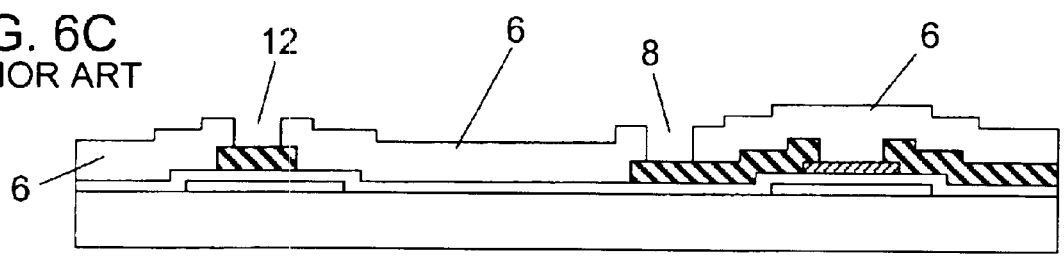
Figure 6D:
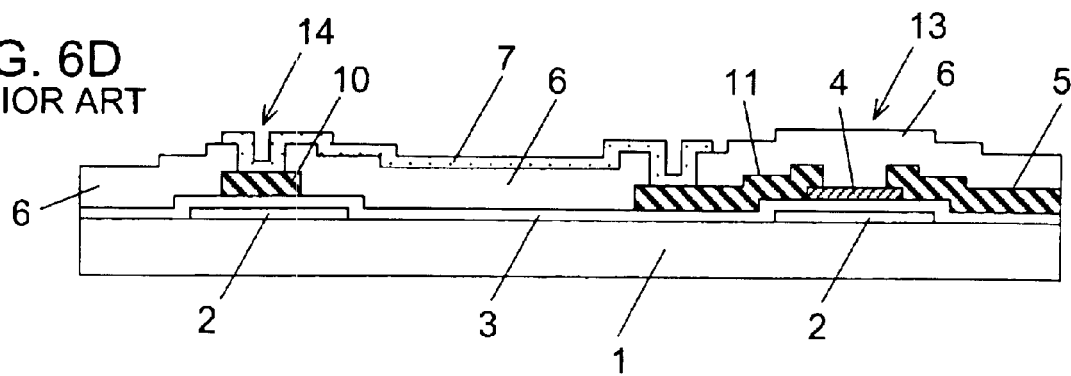

Next, manufacturing steps of this TFT array are described with reference to FIGS. 5A to 5D. FIGS. 5A to 5D are sectional views taken along a broken line 5—5 in FIG. 1, and illustrate key points in the manufacturing steps. First, a first thin metal layer is sputtered on the glass substrate 1, and the signal line 2 is patterned in steps of photolithography and etching. Then, a first insulating layer 3, which will be the gate insulator, is deposited on an entire face, and a layer of hydrogenated amorphous silicon semiconductor is deposited by CVD over the insulating layer 3 (plasma assisted chemical vapor deposition). The hydrogenated amorphous silicon semiconductor layer is patterned using photolithography and etching to form a pattern of the hydrogenated amorphous silicon semiconductor layer 4 TFT channel. According to the present invention there is also formed at this step a semiconductor layer island 9 on the insulating layer 3 in the area of the storage capacitor 14 (FIG. 5A). Then, a second thin metal layer is deposited, and patterns of the video signal line 5, drain electrode 11, and upper electrode 10 of the storage capacitor are formed through a similar patterning process (FIG. 5B). Next, a second insulating layer 6 is deposited as a passivation layer of the TFT. The second insulating layer 6 is made of an inorganic thin layer such as $SiN_x$ and $SiO_2$, organic thin layer such as acrylic resin, polyimide, polyamide, and polycarbonate, or a deposited layer of their combination. An opening 8 for drain contact and opening 12 for contact with the upper electrode of the storage capacitor are created on this second insulating layer 6 (FIG. 5C). Lastly, a conductive layer, which may be transparent is deposited, and patterned to form the pixel electrode 7 through the well known photolithographic/etching patterning process (FIG. 5D). FIG. 1 shows a sectional view of a completed storage capacitor 14.

In implementing the process, it is preferable to dry etch the pattern of the amorphous semiconductor layer, using fluorocarbon gas, for obtaining good tapered shape. Practically speaking, a doped layer is provided on the surface of the hydrogenated amorphous silicon semiconductor layer 4 to reduce the contact of source and drain, and therefore another step is required. However, since this step is well known and is not directly related to the present invention, its explanation is omitted here.

The position of the pixel electrode 7 is not limited to the position described above. The pixel electrode 7 may also be disposed at a position contacting the glass substrate 1, or directly on the first insulating layer 3. However, by forming the pixel electrode 7 on the second insulating layer 6, the pixel aperture ratio can be increased.

Figure 7:
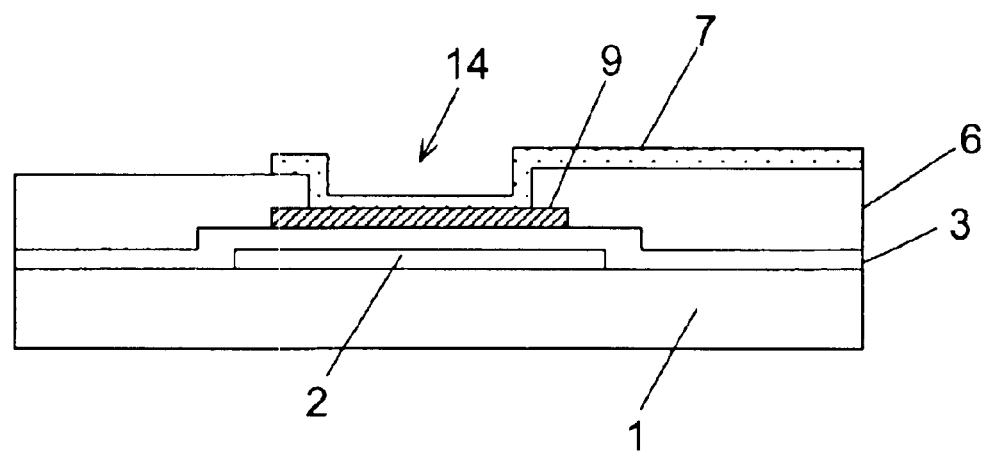
FIG. 7 is a sectional view illustrating another example of the thin film transistor array of the present invention.

Preferably, the upper electrode 10 of the storage capacitor 14 is formed on the same level and using the same material as for the video signal line 5, as shown in FIG. 2. In addition, the pixel electrode 7 may extend in the opening 12 which may be sized to form the upper electrode, as shown in FIG. 7.

As described in the Background of the Invention, the conventional structure and processes for manufacturing the TFT array substrate may result in over-etching of the first insulating layer, which becomes the TFT gate insulator, during the step of etching the TFT channel 4. This results in non-uniform thickness of the remaining layer, causing image defects such as uneven luminance due to non-uniform storage capacitance. The preferred embodiment, as shown in FIGS. 1, 2, and 5A to 5D, prevents over-etching of the first insulating layer 3, which acts as the dielectric of the storage capacitor, during patterning of the semiconductor layer island pattern 9 by disposing the semiconductor layer island pattern 9 between the upper electrode 10 of the storage capacitor 14 and the dielectric consisting of the first insulating layer 3. This makes it possible to form storage capacitors with uniform electric capacitance. To ensure uniformity of the storage capacitance, the semiconductor layer island pattern 9 is preferably made larger than the upper electrode 10.

The preferred embodiment refers to the example of using hydrogenated amorphous silicon for the semiconductor layer. However, it is apparent that the same effects are also achievable with other materials, such as polysilicon.

As described above, the present invention achieves uniform electric capacitance in the storage capacitor, without any additional steps, by disposing a semiconductor layer island pattern larger than the upper electrode between the upper electrode of the storage capacitor and the first insulating layer which becomes the TFT gate insulator. This effect may be used advantageously by using the aforementioned described driving TFT circuit in a liquid crystal display device application. Such display is formed by technology well known in the art and typically comprises enclosing a liquid crystal material between the driver layer containing the pixel electrode and a top transparent electrode usually on the underside of a transparent support. As is well known in the art polarization filters, color filters and other layers may be included as part of the liquid crystal display structure above the pixel layer, such layers having no effect on the present application. According to the present invention, good uniformity in the charge capacitance is achieved. Consequently, uniformity of image quality is improved by minimizing defects such as uneven luminance of the liquid crystal display device.

Those having the benefit of the above disclosure may choose to apply it with certain modifications such as using different methods for patterning and selectively etching the different layers. Similarly, other transistor switching circuit arrangements may be used. These and other similar modifications are to be construed as being encompassed within the scope of the present invention as set forth in the appended claims.

What is claimed is:

1. A thin film transistor array comprising:
   a thin film transistor;
   a pixel electrode electrically connected to said thin film transistor;
   a scanning line connected to said thin film transistor;
   an insulating layer over said scanning line;
   a semiconductor layer over a portion of said insulating layer and said scanning line; and
   a storage capacitor comprising an upper capacitor electrode formed over and contacting said semiconductor layer electrically connected to said pixel electrode.

2. A thin film transistor array according to claim 1, wherein said storage capacitor further comprises a lower electrode and wherein said scanning line serves as the lower electrode.

3. A thin film transistor array according to claim 2, further comprising a signal line formed at a level above said scanning line at a substantially right angle thereto and electrically insulated therefrom, and wherein said upper capacitor electrode for forming said storage capacitor is made of a same material and formed on the same level as said signal line.

4. A thin film transistor array according to claim 2, wherein said semiconductor layer is patterned into an island shape wider than said upper capacitor electrode.

5. A thin film transistor array according to claim 1, further comprising a second insulating layer over said upper capacitor electrode said second insulating layer forming an opening therethrough in an area of said second insulating layer over said upper capacitor electrode.

6. A thin film transistor array according to claim 5, wherein said pixel electrode extends and contacts said upper capacitor electrode through said opening.

7. A thin film transistor array according to claim 1, wherein a portion of said pixel electrode forms said upper capacitor electrode.

8. A thin film transistor array according to claim 1, wherein the semiconductor layer comprises hydrogenated amorphous silicon.

9. A thin film transistor array for driving a display device that includes an array of a plurality of display elements, each of said display elements having a pixel electrode, the thin film transistor array including an array of scanning lines and an array of signal lines, the signal lines begin arrayed substantially perpendicular to the scanning lines and electrically insulated therefrom, and a plurality of individual drivers, one driver for each display element, each of said individual drivers comprising:
   a thin film transistor connected to one of said scanning lines and said pixel electrode; and
   a storage capacitor electrically connected to said pixel electrode comprising an upper capacitor electrode, a dielectric layer and a lower electrode wherein said dielectric layer comprises an insulating layer over said lower electrode and a semiconductor layer over said insulating layer and under and contacting said upper capacitor electrode.

10. A thin film transistor array including an array of liquid crystal display elements, each having a pixel electrode, the thin film transistor array further including an electronic circuit for driving thin film transistor array, the electronic circuit including an array of scanning lines and an array of signal lines, the signal lines being arrayed substantially perpendicular to the scanning lines and electrically insulated therefrom, and a plurality of individual drivers, one driver for each display element, each of said individual drivers comprising:

a thin film transistor connected to one of said scanning lines and said pixel electrode; and a storage capacitor electrically connected to said pixel electrode, comprising an upper capacitor electrode, a lower electrode and a dielectric layer therebetween, wherein said dielectric layer comprises a first insulating layer over said lower electrode and a semiconductor layer over said first insulating layer and under and contacting said upper capacitor electrode.

11. A thin film transistor array according to claim 1, further comprising a substrate, wherein said scanning line is formed art said substrate.

* * * * *

UNITED STATES PATENT AND TRADEMARK OFFICE
CERTIFICATE OF CORRECTION

| | | |
|---|---|---|
| PATENT NO. | : 6,831,318 B2 | Page 1 of 1 |
| APPLICATION NO. | : 10/368188 | |
| DATED | : December 14, 2004 | |
| INVENTOR(S) | : Hiroaki Yonekura et al. | |

It is certified that error appears in the above-identified patent and that said Letters Patent is hereby corrected as shown below:

<u>Title Page,</u>

Item (54), "THIN FILM TRANSISTOR ARRAY" should read -- THIN FILM TRANSISTOR ARRAY AND ITS MANUFACTURING METHOD --.

<u>Column 8,</u>

Line 12, "art" should read -- on --.

Signed and Sealed this

Twelfth Day of December, 2006

JON W. DUDAS
*Director of the United States Patent and Trademark Office*